(12) United States Patent
Naviasky et al.

(10) Patent No.: US 8,502,586 B1
(45) Date of Patent: Aug. 6, 2013

(54) METHODS OF CLOCK SIGNAL GENERATION WITH SELECTED PHASE DELAY

(75) Inventors: Eric Naviasky, Ellicott City, MD (US); Thomas E. Wilson, Laurel, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 12 days.

(21) Appl. No.: 13/287,109

(22) Filed: Nov. 1, 2011

Related U.S. Application Data

(63) Continuation of application No. 12/270,038, filed on Nov. 13, 2008, now Pat. No. 8,063,686.

(60) Provisional application No. 61/076,361, filed on Jun. 27, 2008.

(51) Int. Cl.
*H03H 11/16* (2006.01)
*H03K 5/13* (2006.01)

(52) U.S. Cl.
USPC ............ 327/231; 327/238; 327/239; 327/254

(58) Field of Classification Search
USPC ......... 327/141, 144–163, 231–290, 534–537; 331/1 A, 15–17; 363/59, 60; 375/373–376
See application file for complete search history.

(56) References Cited

U.S. PATENT DOCUMENTS

| | | | |
|---|---|---|---|
| 5,021,749 A | | 6/1991 | Kasai et al. |
| 5,886,551 A | * | 3/1999 | Narahara ...................... 327/157 |
| 5,898,328 A | * | 4/1999 | Shoji .............................. 327/157 |
| 6,141,163 A | * | 10/2000 | Nakamura et al. ............. 360/51 |
| 6,222,401 B1 | * | 4/2001 | Yoon .............................. 327/156 |
| 6,380,783 B1 | * | 4/2002 | Chao et al. .................... 327/258 |
| 6,392,495 B1 | * | 5/2002 | Larsson .......................... 331/11 |
| 8,063,686 B1 | | 11/2011 | Naviasky et al. |
| 2003/0215039 A1 | | 11/2003 | Block et al. |
| 2005/0068074 A1 | * | 3/2005 | Yahagi et al. ................. 327/157 |
| 2006/0256911 A1 | | 11/2006 | Rosik et al. |
| 2007/0030046 A1 | * | 2/2007 | Pai et al. ....................... 327/290 |
| 2007/0273415 A1 | | 11/2007 | Kimura et al. |
| 2009/0108892 A1 | | 4/2009 | Chen et al. |

* cited by examiner

*Primary Examiner* — Lincoln Donovan
*Assistant Examiner* — Brandon S Cole
(74) *Attorney, Agent, or Firm* — Alford Law Group, Inc.

(57) ABSTRACT

In one embodiment of the invention, a method is disclosed to generate a clock output signal with selected phase. The method includes selecting a phase delay for the clock output signal; charging a capacitor with a first weighted current during a first phase input clock, charging the capacitor with a second weighted current during a portion of a second phase input clock, and determining if a voltage across the capacitor is greater than or equal to a threshold voltage to generate a first edge of the clock output signal with the selected phase delay. The first weighted current may have a weighting of N out of M to charge the capacitor with a predetermined rate of change in voltage in response to the selected phase delay. The second weighted current may have a weighting of M out of M to charge the capacitor with a constant rate of change.

12 Claims, 11 Drawing Sheets

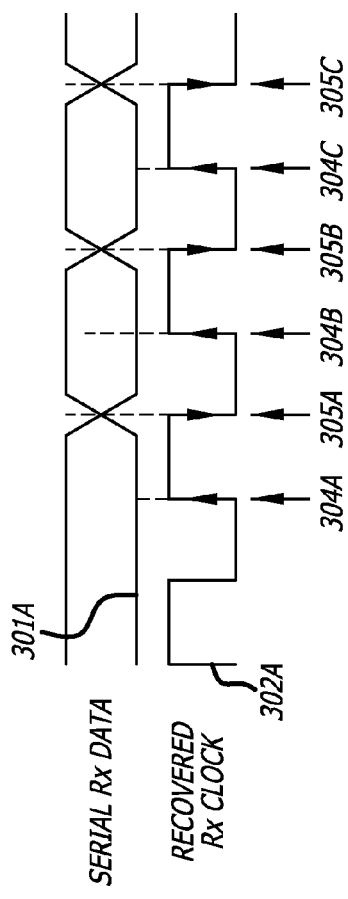
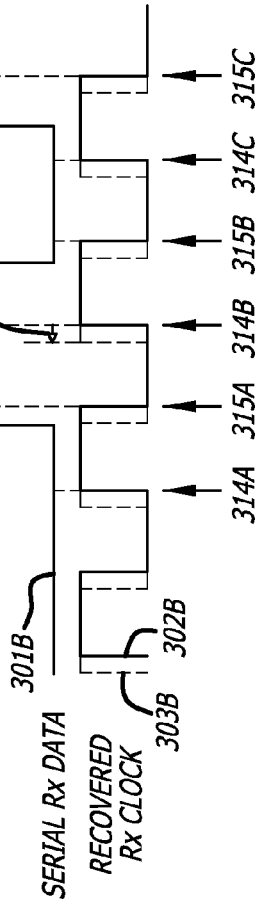
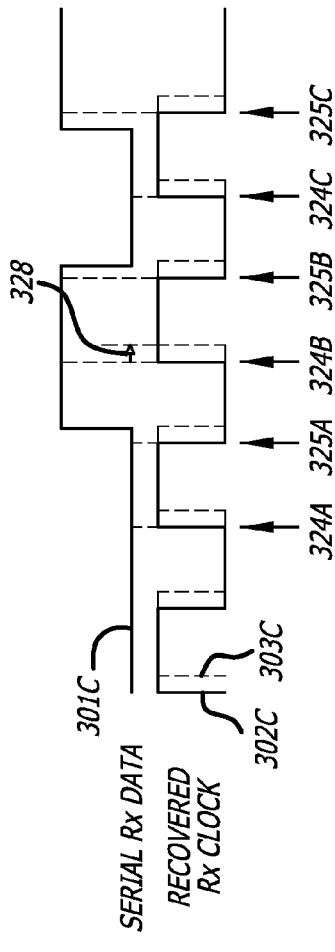

ate quadrant and even cycle handoff of the selectable phase
METHODS OF CLOCK SIGNAL GENERATION WITH SELECTED PHASE DELAY

CROSS REFERENCE TO RELATED APPLICATIONS

This non-provisional United States (U.S.) patent application is a continuation application claiming the benefit of non-provisional U.S. patent application Ser. No. 12/270,038 filed on Nov. 13, 2008 by inventors, Eric Naviasky et al., entitled PHASE INTERPOLATOR CIRCUIT WITH TWO PHASE CAPACITOR CHARGING, now allowed, that claims the benefit of provisional U.S. Patent Application No. 61/076,361 filed on Jun. 27, 2008 by inventors, Eric Naviasky et al., entitled PHASE INTERPOLATOR CIRCUIT WITH TWO PHASE CAPACITOR CHARGING, now expired.

FIELD

The embodiments of the invention relate generally to clock recovery circuits.

BACKGROUND

High speed serial communication is becoming more common with electronic systems and electronic components. For example, high speed serial interconnections may be used for input ports and output ports for integrated circuit devices to meet data transmission requirements of higher capacity chips that may be pin limited, such as systems on chip (SOCs) or application specific integrated circuits (ASICs). Other wired or cable applications of high speed serial communication is for system bus backplanes and communication network systems.

To facilitate data transmission over a serial interconnect or data link, a clock may be embedded into the serial data stream of data bits prior to transmission at a transmitting end. At the receiving end of the serial data link, clock and data are recovered from the received serial clock/data signal.

Some industry standards specify high speed serial communication links such as PCIe, CEI-6, XAUI (IEEE 802.3ae), SATA, and Fiber-channel. Data transfer rates for serial communication links may be at high data bit speeds such as in the range from 2.5 gigabits per second (Gb/s) to 20 Gb/s or more.

BRIEF SUMMARY

The embodiments of the invention are best summarized by the claims that follow below.

Briefly however, a phase interpolator circuit design suitable for fabrication in small geometry CMOS processes is disclosed. The phase interpolator circuit may be used in applications such as clock data recovery circuits and precision timing generators. The phase interpolator circuit employs a two phase capacitor charging approach to produce a variable delay. The variable delay may be used to modify the phase of an input clock to generate an output clock with a selectable phase shift. The circuit may be controlled with continuous rotating phase updates to generate output frequencies that may be offset by several hundred parts per million (ppm) from the input clock so that it may be employed in a clock recovery circuit. A digital control circuit selects the desired phase delay and sets weights of a segmented linear current source formed of a plurality of linear current sources. The linear current sources charge a capacitor in two groups, beginning at different times controlled by two quadrature phases of the input clock. When the charge on the capacitor exceeds a fixed threshold, the output clock is triggered. The control circuit is self-resetting to allow the circuit to produce a continuously rotating phase output. The circuit provides continuous glitch-free quadrant handoffs and can be rapidly updated to generate the output clock.

BRIEF DESCRIPTIONS OF THE DRAWINGS

FIGS. 3A-3C are waveform timing diagrams of serial received data signal waveforms and serial receive clock waveforms.

DETAILED DESCRIPTION

Figure 1:
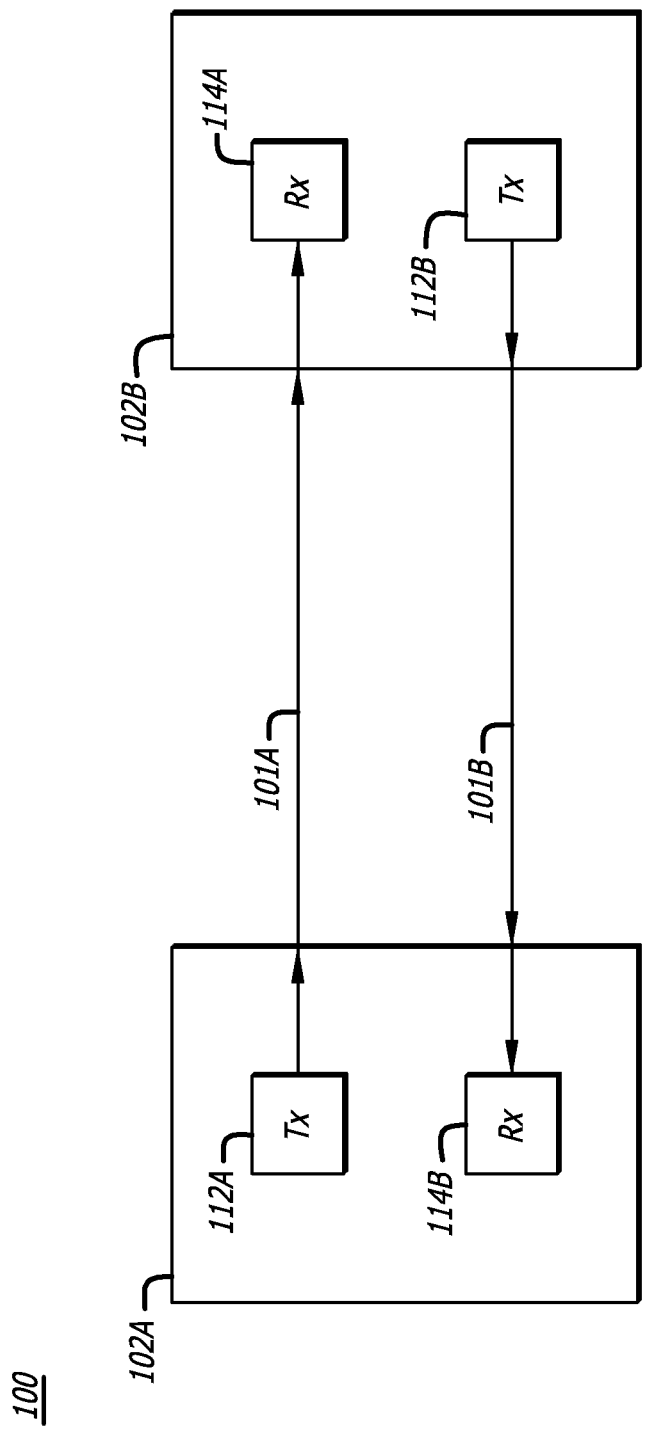
FIG. 1 illustrates a functional block diagram of an electronic system with one or more serial communication links including a receiver with a deserializer having a phase interpolator.

In the following detailed description of the embodiments of the invention, numerous specific details are set forth in order to provide a thorough understanding of the embodiments of the invention. However, the embodiments of the invention may be practiced without these specific details. In other instances well known methods, procedures, components, and circuits have not been described in detail so as not to unnecessarily obscure aspects of the embodiments of the invention.

Introduction

More serial communication links with greater speeds are being designed into integrated circuits with smaller geometry manufacturing processes, such as complementary metal oxide semiconductor (CMOS) processes with less than ninety nanometers feature sizes. With a large number of serial links in a large digital ASIC, it may be desirable to design a CMOS receiver with clock data recovery having low power consumption and small area consumption. Moreover to support still higher frequencies, finding a solution that has lower power and can provide higher performance is desirable as the serial links increase in number and data transmission frequencies increase.

Integrated circuit processes for digital circuits are often tuned to optimize the performance of data processing chips such that digital CMOS transistor switching performance is optimized over analog CMOS transistor performance. It may be preferable to design a CMOS receiver with clock data recovery using digital switching gates instead of linear analog components. This can ease circuit portability from manufacturing process to manufacturing process while using transistors whose performance is tied to the same device parameters for which the integrated circuit is optimized.

A phase interpolator circuit design suitable for fabrication in small geometry CMOS processes is disclosed. The phase interpolator circuit may be used in applications such as clock data recovery circuits and precision timing generators. The phase interpolator circuit employs a two phase capacitor charging approach to produce a variable delay. The variable delay may be used to modify the phase of an input clock to generate an output clock with a selectable phase shift. The circuit may be controlled with continuous rotating phase updates to generate output frequencies that may be offset by several hundred parts per million (ppm) from the input clock so that it may be employed in a clock recovery circuit. A digital control circuit selects the desired phase delay and sets weights of a segmented linear current source formed of a plurality of linear current sources. The linear current sources charge a capacitor in two groups, beginning at different times controlled by two quadrature phases of the input clock. When the charge on the capacitor exceeds a fixed threshold, the output clock is triggered. The control circuit is self-resetting to allow the circuit to produce continuously rotating phase output. The circuit provides continuous glitch-free quadrant handoffs and can be rapidly updated to generate the output clock.

Referring now to FIG. 1, an electronic system 100 with one or more serial communication links 101A-101B is illustrated. The electronic system 100 includes a first circuit 102A and a second circuit 102 coupled in communication together by the one or more serial communication links 101A-101B. If unidirectional communication is desirable, the one or serial communication links may support data flow in one direction, such as from the first circuit 102A to the second circuit 102B. If bi-directional serial communication is desirable, a pair of serial communication links may be used to support data flow in both directions. For example as shown in FIG. 1, the serial communication link 101A supports serial data flow from the first circuit 102A to the second circuit 102B and the serial communication link 101B supports serial data flow from the second circuit 102B to the first circuit 102A. In either case, one circuit has a serial data transmitter 112A-112B while the other circuit respectively has a serial data receiver 114A, 114B. Each serial data transmitter includes a serializer while each serial data receiver includes a deserializer. Sometimes, the serial data receiver and the serial data transmitter in the same circuit are logically associated together as a serial transmitter/receiver (transceiver) having a serializer/deserializer (SerDes).

Figure 2A:
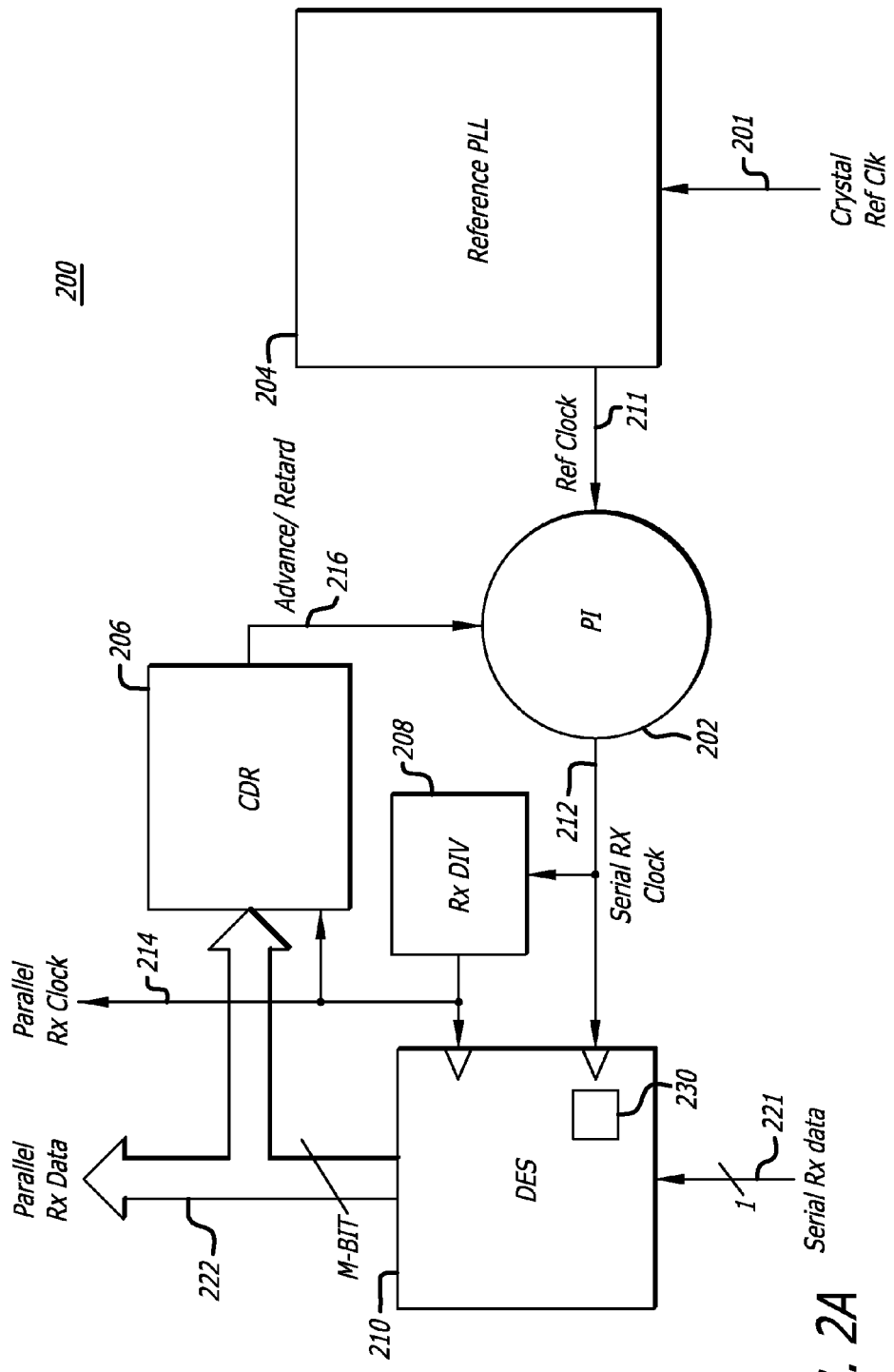
FIG. 2A is a functional block diagram of a phase interpolator clock and data recovery (CDR) circuit loop including a phase interpolator.

Referring now to FIG. 2A, a phase interpolator clock and data recovery (CDR) circuit loop 200 is illustrated. The phase interpolator CDR circuit loop 200 is included as part of a serial data receiver 114A-114B and includes a phase interpolator (PI) 202, a reference phase locked loop clock oscillator 204, clock and data recovery circuit, a receive clock divider 208, and a deserializer 210 coupled together in a circuit loop as shown.

The circuit loop generates a sampling serial receive clock 212 in an offset digital loop from a reference clock 211 generated by a reference phase locked loop clock oscillator 204. A deserializer 210 samples the serial receive data 221, a serial data input waveform, with the sampling serial receive clock 212. For clock and data recovery, the deserializer 210 may include a sampling circuit 230.

Figure 2B:
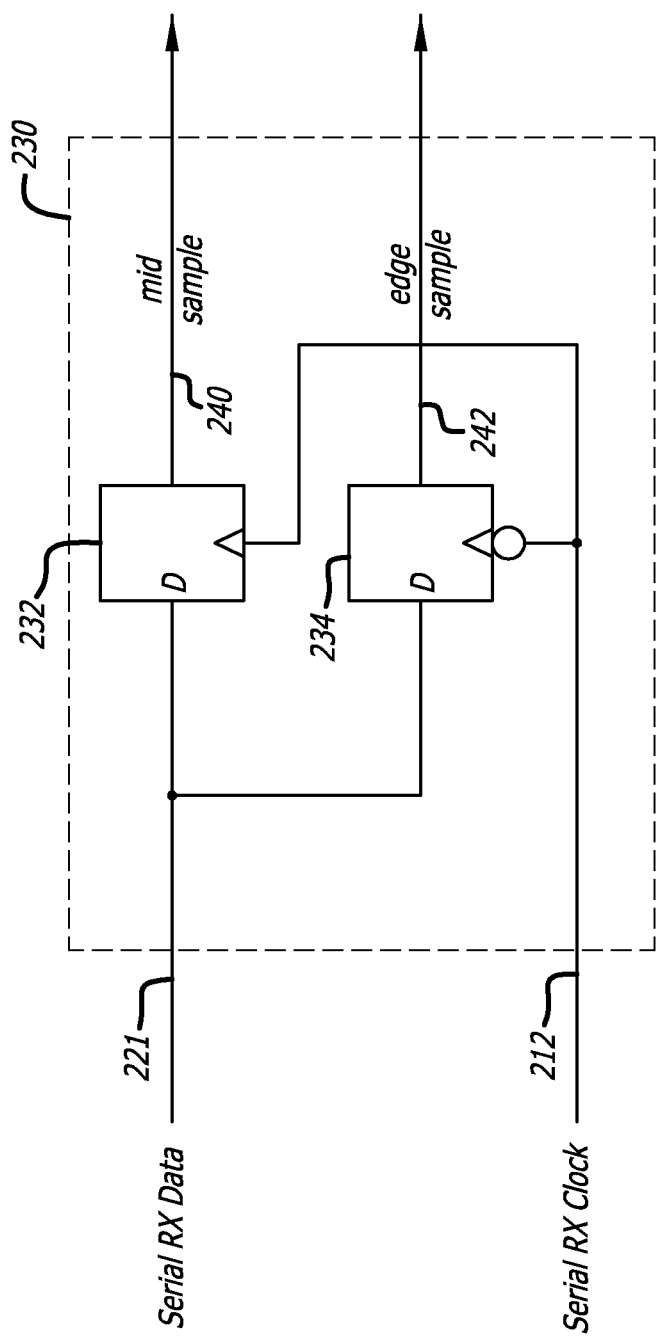
FIG. 2B is a functional block diagram of an exemplary sampling circuit in the deserializer that may couple to the phase interpolator clock and data recovery (CDR) circuit loop to receive a serial receive clock.

Referring now to FIG. 2B, an exemplary sampling circuit 230 is illustrated. The sampling circuit 230 includes a first D flip flop 232 and a second D flip flop 234 coupled together as shown to respectively generate a mid sampled signal 240 and an edge sampled signal 242.

Referring now to FIGS. 2B and 3A, the first D flip flop 232 is configured to sample the serial received data signal 221 on the rising edge of the serial receive clock 212. That is, the first D flip flop 232 is configured to sample the serial received data signal 221 near an expected mid pulse or steady state to better acquire the embedded data signal. FIG. 3A shows a serial received data signal waveform 301A (corresponding to the serial receive data 221) being sampled on the rising edges 304A-304C of a serial receive clock waveform 302A (corresponding to the serial receive clock 212).

The second D flip flop 234 has an inverted clock input (provided by an inverter for example) to sample the serial received data signal 221 on the falling edge of the serial receive clock 212. That is, the second D flip flop 234 is configured to sample the serial received data signal 221 near expected transitioning edges to better acquire the embedded clock signal and generate the serial receive clock signal. FIG. 3A shows the serial received data signal waveform 301A (corresponding to the serial receive data 221) being sampled on the falling edges 305A-305C of the serial receive clock waveform 302A (corresponding to the serial receive clock 212).

The phase interpolator (PI) circuit 202 receives the fixed reference clock 211 generates the serial receive clock 212 with a different phase in response to an advance/retard control signal 216 generated by the clock and data recovery (CDR) circuit. The phase interpolator circuit 202 may divide the cycle of the input reference clock 211, such as by 32, 64, or 128 and according output phase at a corresponding resolution, such as $\frac{1}{32}$, $\frac{1}{64}$, or $\frac{1}{128}$ of a cycle respectively. The advance/retard control signal 216, a digital signal, causes the phase interpolator circuit 202 to select an output phase for the serial receive clock 212. The phase interpolator circuit 202 is provided with at least three clock phases (e.g., see FIG. 4B illustrating four reference clock phases) of the reference clock and interpolates a large number of intermediate phases to generate the output serial receive clock 212. In the circuit loop, the phase of serial receive clock is updated (continuous rotating phase updates) to generate output frequencies for the serial receive clock 212 which may be offset by several hundred parts per million from the input reference clock 211 for clock recovery.

Referring momentarily to FIGS. 3B-3C, the phase interpolator circuit 202 may be used to shift the phase of the serial received clock signal 212. For example, the phase interpolator circuit 202 may advance the phase of the serial received clock signal from clock signal 302B to clock signal 303B by the phase difference 318. Alternatively, the phase interpolator circuit 202 may be used to retard the phase of the serial received clock signal from clock signal 302C to clock signal 303C by the phase difference 328 for example.

While the phase interpolator circuit 202 is being used in the serial data receiver for clock and data recovery, the phase interpolator circuit 202 may be applied in other electronic systems. The phase interpolator circuit 202 may be used in any application where a clock of a selectable phase is generated. For example, the phase interpolator circuit 202 may be used for precision timing generation in test equipment, clock skew control, wired communication systems like Ethernet, and RF applications, such as Cartesian transmitter systems that require the phase of the I/Q feedback signals at the Cartesian summation point to be out of phase (180 degree phase shift) relative to the I/Q reference signals.

With smaller geometry devices, digital power supply voltages becoming smaller, and operational frequencies becoming greater, it is desirable to avoid using a precision analog circuit design for the phase interpolator circuit 202.

Phase Interpolator

Figure 4A:
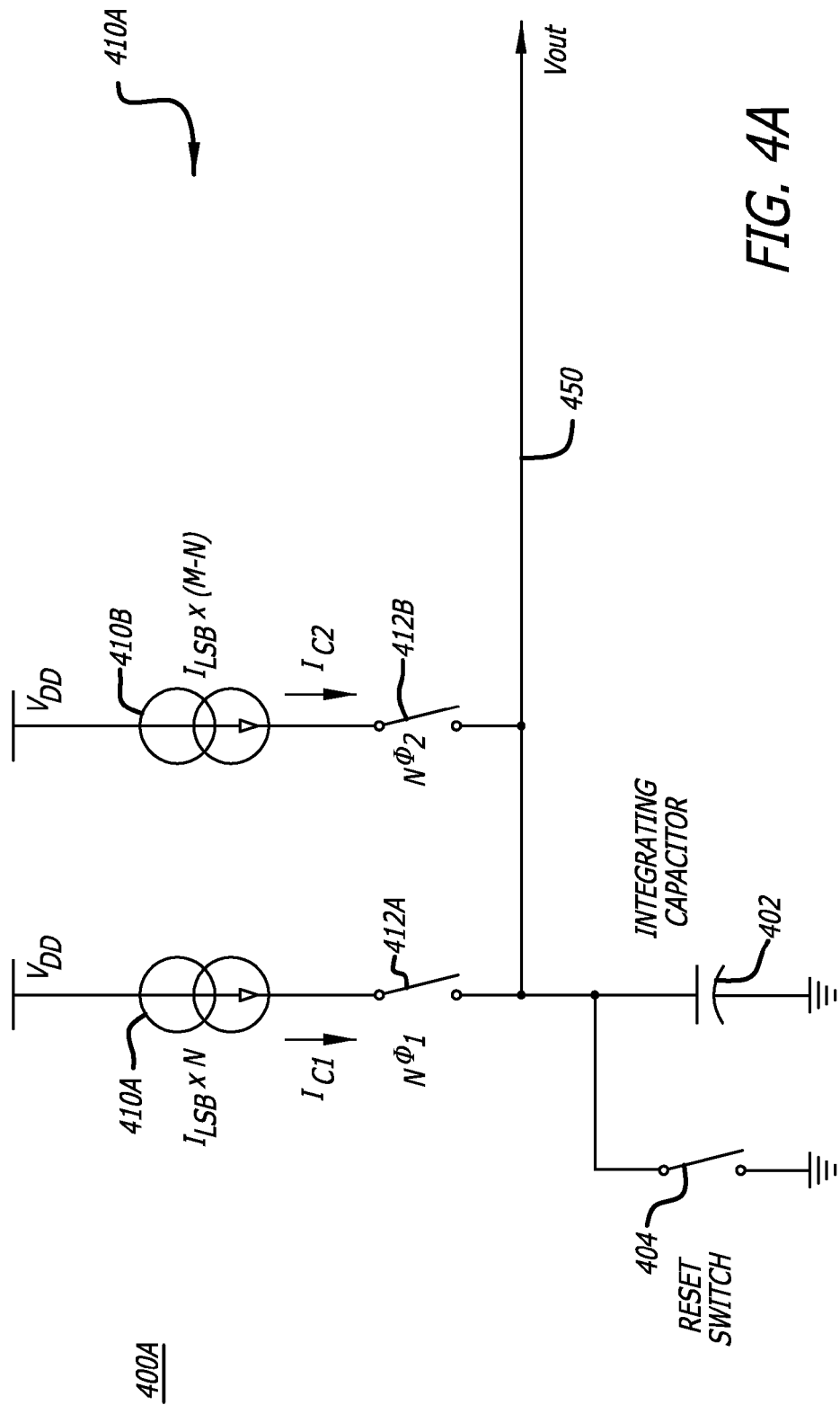
FIG. 4A is a schematic diagram of an exemplary embodiment of a phase interpolator circuit.
Figure 4B:
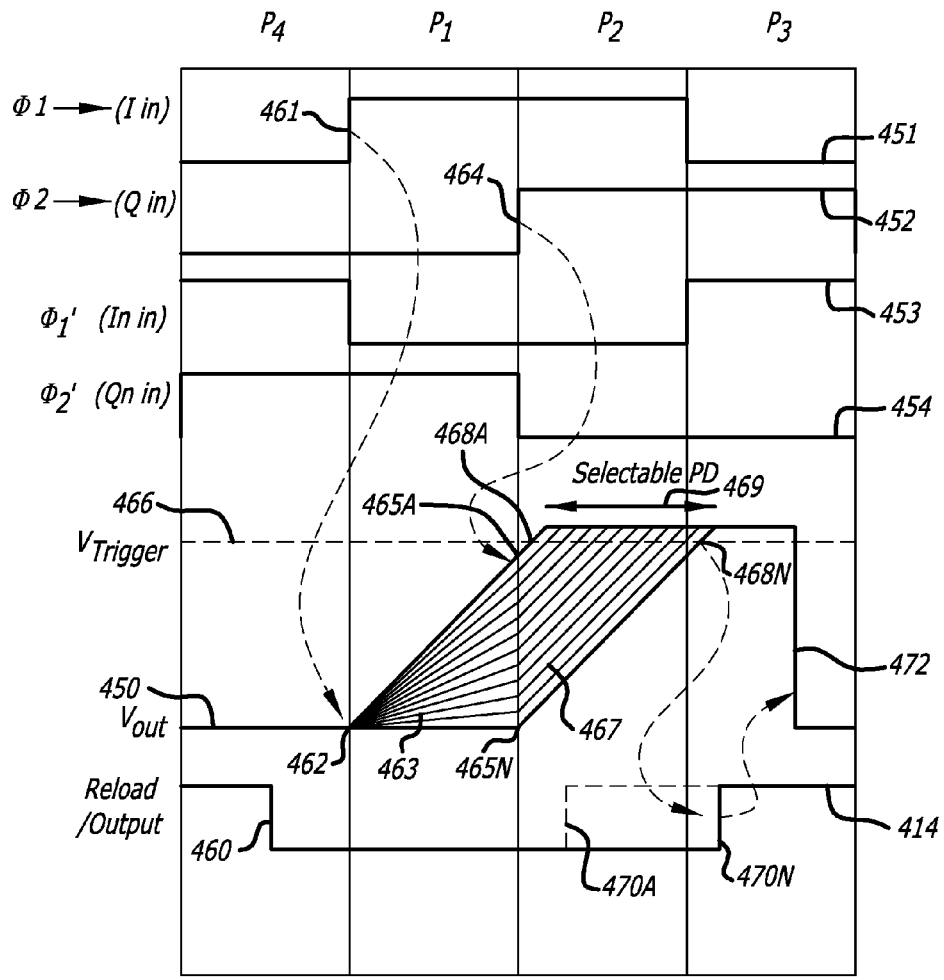
FIG. 4B are exemplary waveform timing diagrams for signals of embodiments of the phase interpolator circuit.

Referring now to FIG. 4A, a schematic illustration of a phase interpolator circuit 400A is illustrated as an embodiment of the phase interpolator circuit 202 illustrated in the clock and data recovery circuit loop 200. The phase interpolator 400A includes an integrating capacitor 402, a reset switch 404, and a segmented current source 410A. When the reset switch 404 is on, it dissipates the charges on the integrating capacitor 402 to discharge it and decrease the output voltage of the output signal on the output Vout 450. When the reset switch 404 is off, the segmented current source 410A selectively couples charges onto the integrating capacitor 402 to charge it up and increase the output voltage of the output signal on the output Vout 450 over a variable period of time during portions of two consecutive phases of the serial received clock.

The segmented current source 410A includes a first current source leg and a second current source leg having parallel pairs of high speed switches 414A-414B coupled in series to respective current sources 410A-410B. The current sources 410A-410B may be multiplying current sources generating levels of current $I_{c1}$ and $I_{c2}$ respectively. The level of current $I_{c1}$ generated by the current source 410A is N times the least significant bit current (the single unit of current) $I_{LSB}$ ($I_{LSB} \times$ N). The level of current $I_{c2}$ generated by the current source 410B is (M−N) times the least significant bit current ($I_{LSB} \times$ (M−N)) with the integer value of M being greater than the integer value of N. The value of M times the least significant bit current ($I_{LSB} \times M$) is the maximum sum of current $I_{c1}$ and $I_{c2}$ coupled into the capacitor 402 to charge it and increase the output voltage of the output signal on the output Vout 450 over time at a constant rate.

The value of N selects a variable percentage of total current available to charge the integrating capacitor 402 in the first phase and first half of its charge cycle. The value of (M−N) is the remaining percentage of total current available that is added to charge the integrating capacitor 402 in the second phase and second half of the charge cycle. If the value of M is 32, for example, the value of N may be a number ranging between 1 and 32 inclusively. If N is selected to be 5 with M being 32, for example, the level of current $I_{c1}$ provided by the current source 410A is $5I_{LSB}$ and the level of current $I_{c2}$ generated by the current source 410B is (32-5) times the least significant bit current $I_{LSB}$ or $27I_{LSB}$.

Reference is now made to FIG. 4A and FIG. 4B. FIG. 4B illustrates waveform timing diagrams for the signals of the schematic diagram of FIG. 4A. Over two consecutive clock phases of the serial received clock, the high speed switch 412A is first switched closed (switched on) so the current $I_{c1}$ can charge the capacitor 402 and then the high speed switch 414B is switched closed (switched on) so the sum of currents $I_{c1}$ and $I_{c2}$ can charge the capacitor. Generally across a capacitor, the rate of change in voltage per change in time (slope of a voltage waveform) is the current into the capacitor divided by the capacitance of the capacitor, $\Delta V/\Delta T = I_c/C$. By varying the level of current into a capacitor, the slope ($\Delta V/\Delta T$) of a voltage waveform can be varied.

If a quadrature phase clock system (clocks 451-454 each out of phase from the other by ninety degrees) is used, the high speed switch 412A may be selectively switched on by a phase one clock $\Phi_1$ 451 and the high speed switch 412B may be switched on by a phase two clock $\Phi_2$ 452 as illustrated for example. Alternatively, the high speed switches 412A-412B may respectively be selectively switched on by consecutive phases of phase two clock $\Phi_2$ 452 and phase three clock $\Phi_3$ 453, phase three clock $\Phi_3$ 453 and phase four clock $\Phi_4$ 454, or phase four clock $\Phi_4$ 454 and phase one clock $\Phi_1$ 451. There is an overlapping time period (a portion of period P2) when both of the pairs of high speed switches 412A-412B are switched on. However, both of the pairs of high speed switches 412A-412B are switched off at the same time by a rising edge (e.g., 470A-407N) of the reset signal 414 that may also be used to turn on the reset switch 404.

After the output voltage of the output signal on the output Vout 450 is reset to ground or zero volts by the reset switch 404, the reset switch is turned off by a falling edge 460 of the reset signal 414. The weight of N of M current segments may then turned on during the rising edge of the first phase, phase one clock $\Phi_1$ for example. The high speed switch 412A is turned on by the rising edge 461 of the phase one clock 451 to achieve a desired delay in the rising edge of the output voltage of the output signal on the output Vout towards the positive power supply voltage Vdd. As the value of N can vary, the level of current $I_{c1}$ generated by the multiplying current source 412A can vary such that the initial rising slope 463 can be selected to points 465A-465N during period 1 in the output voltage of the output signal on the output Vout 450 (N/M charging slope) depending upon desired delay.

The remaining (M−N) out of M current segments is then selectively turned on during the rising edge 464 of the second phase, phase two clock $\Phi_2$ for example. The initially selected N of M current segments remain turned on after the rising edge 464 of the second phase so that when summed together with the paired selected (M−N) of M current segments, the secondary slope 467 from the respective points 465A-465N through points 468A-468N in the output voltage of the output signal on the output Vout 450 is substantially similar (a constant charging slope). However, the starting point 465A-465N for the constant slope 467 differs so that the output voltage waveform 450 shown in FIG. 4B of the output signal on the output Vout will cross the triggering threshold voltage $V_{trigger}$ at a different point in time with respect to the phase one and phase two clock signals. In response to the selected value of N, a varied percentage of total current charging the integrating capacitor 402 in the first phase and first half of its charge cycle causes the variable phase delay 469 in generating the edge 470A-470N of the serial received clock. That is, the variable phase delay 469 in the output voltage of the output signal on the output 450 is selectable.

When the output voltage of the output signal on the output Vout 450 and the integrated capacitor C 402 reaches the predetermined triggering threshold voltage level $V_{trigger}$ 466 at one of the points 468A-468N in response to the charging current from the selected current segments 410, it triggers a triggering or fast self-resetting circuit to generate a respective edge 470A-470N of the serial received clock and reset signal 460. The respective edge 470A-470N of the serial received clock and reset signal 414 switches on the reset switch 404 to reset the output voltage of the output signal on the output Vout 450 by discharging it to ground or zero volts as indicated by the falling edge 472. That is the respective edge 470A-470N in the output waveform triggers the reset of the circuit before the next charge cycle of the integrating capacitor begins.

Because the capacitance of the capacitor 402, the current of the current sources in the segmented current source 410A, and the predetermined triggering threshold voltage may be substantially constant for power supply voltage and transistor variations, the selected charge slope 467 set by the weight N is substantially the same. Thus, the embodiment of the phase interpolator can provide good segment matching and uniformity in the time step as the selected phase delay 469 is varied. Moreover, because the predetermined triggering threshold voltage 466 can be made substantially constant by the triggering circuit, the linearity of the capacitance of the integrating capacitor 402 versus voltage may be an irrelevant factor.

Figure 4C:
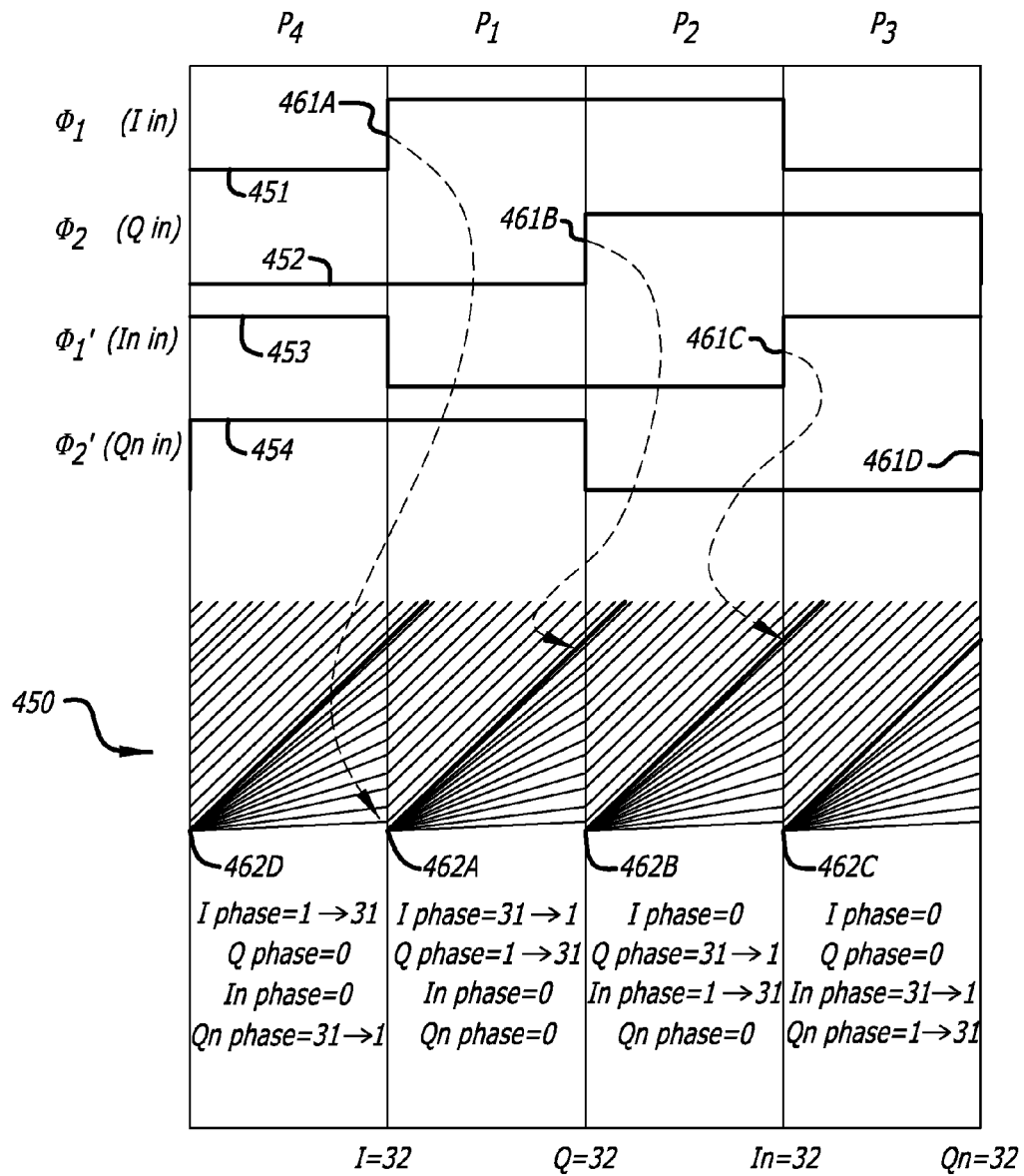
FIG. 4C are exemplary waveform timing diagrams to illustrate quadrant and even cycle handoff of the selectable phase delay range.
Figure 4D:
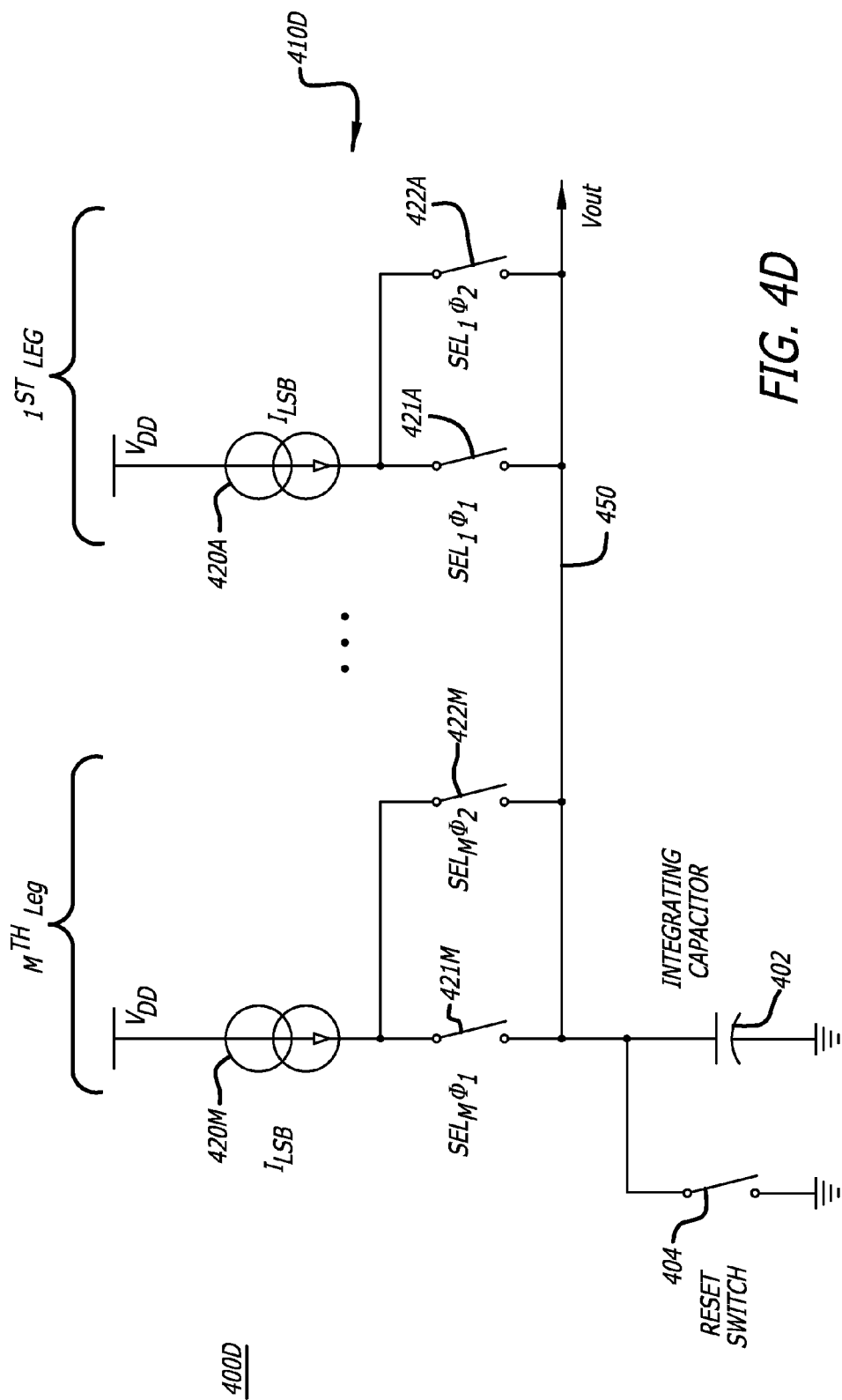
FIG. 4D is a schematic diagram of another exemplary embodiment of a phase interpolator circuit.

Referring now to FIG. 4D, a schematic illustration of a phase interpolator circuit 400D is illustrated as another embodiment of the phase interpolator circuit 202. The phase interpolator 400D includes the integrating capacitor 402, the reset switch 404, and a segmented current source 410D. When the reset switch 404 is on, it dissipates the charges on the integrating capacitor 402 to discharge it and decrease the output voltage of the output signal on the output Vout 450. When the reset switch 404 is off, the segmented current source 410D selectively couples charges onto the integrating capacitor 402 to charge it up and increase the output voltage of the output signal on the output Vout 450 over a variable period of time during portions of two consecutive phases of the serial received clock.

The segmented current source 410D includes M legs having parallel pairs of high speed switches 421A-421M and 422A-422M coupled in series to respective constant current sources 420A-420M. Each of the constant current sources 420A-420M generates a least significant bit current (the single unit of current) $I_{LSB}$.

In an alternate embodiment of the invention, the parallel pairs of high speed switches 421A-421M and 422A-422M in each leg may be a single high speed switch with a control terminal that is controlled by a switch controller with a control logic that is responsive to a plurality of control signals. Further in another embodiment of the invention, the position of the single high speed switch or the pair of high speed switches 421A-421M and 422A-422M may be swapped with the current source 420A-420M in each leg such that positive power supply to the current source is switched on and off.

The level of current $I_{c1}$ coupled into the capacitor 402 during a first charge phase depends upon how many (N) of the high speed switches 421A-421M are selectively switched on by SELiPHI1 control signals. The level of current $I_{c1}$ is N times the least significant bit current (the single unit of current) $I_{LSB}$ ($I_{LSB} \times N$). The level of current $I_{c2}$ additionally coupled into the capacitor 402 during a second charge phase depends upon how many (M−N) of the high speed switches 422A-422M are selectively switched on by SELiPHI2 control signals. The level of current $I_{c2}$ is (M−N) times the least significant bit current ($I_{LSB} \times (M-N)$) with the integer value of M being greater than the integer value of N. The value of M times the least significant bit current ($I_{LSB} \times M$) is the maximum sum of current $I_{c1}$ and $I_{c2}$ coupled into the capacitor 402 to charge it and increase the output voltage of the output signal on the output Vout 450 over time at a constant rate.

The waveform timing diagrams illustrated in FIG. 4B are also relevant of the signals of the schematic diagram of FIG. 4D. Selective ones of the high speed switches 421A-421M are selectively turned on by the rising edge 461 of the phase one clock 451 to achieve a desired delay in the rising edge of the output voltage Vout towards the positive power supply voltage Vdd. Selective ones of the high speed switches 422A-422M are selectively turned on by the rising edge 464 of the phase two clock 452 (while selective ones of the switches 421A-421M remain on) to achieve a constant slope the output voltage of the output signal on the output Vout towards the positive power supply voltage Vdd.

Quadrant/Even Cycle Handoff

Note that the phase one clock PHI1 $\Phi_1$ and phase two clock PHI2 $\Phi_2$ used to respectively switch on and off the switches 412A-412B may be changed during the operation of the circuit to allow for quadrant and even cycle handoff of the delay range 469. This may be performed by selecting which of the quadrature phases is to be the clock phase for the second charge cycle of the integrating capacitor.

FIG. 4C illustrates waveform timing diagrams to illustrate quadrant and even cycle handoff of the selectable phase delay range 469. For example, the rising edge 461A of the phase one clock $\Phi_1$ 451 may be used to start from point 462A the first charge cycle of the integrating capacitor and generate the selectable slope 463 during period 1 (P1) in the output waveform 450 of the output signal on the output Vout 450. Ordinarily the phase two clock $\Phi_2$ 452 may be used to selectively switch the switches 412B for the second charge cycle of the integrating capacitor during period 2 (P2) on the rising edge 461B. However, it may be desirable to further delay the clock generation by ninety degrees into the next clock phase. Thus, the rising edge 461C of the phase three clock $\Phi_3$ 453 may be used instead to selectively switch the switches 412B for the second charge cycle of the integrating capacitor during period 3 (P3).

Additionally, the initial phase of the clock phases may be alternatively selected. Instead of beginning the first charge cycle of the capacitor 402 with the rising edge 461A of the phase one clock $\Phi_1$ 451 at point 462A on the output waveform 450 of the output signal on the output Vout, the first charge cycle may alternatively begin at point 462B on the rising edge 461B of the phase two clock $\Phi_2$ 452, at point 462C on the rising edge 461C of the phase three clock $\Phi_3$ 453, or at point 462D on the rising edge 461D of the phase four clock $\Phi_4$ 454.

The handoffs may occur when either Φn has zero weight or near zero weight so that glitches do not occur in the output waveform 450 of the output signal on the output Vout and falsely trigger the trigger or reset circuit. With the zero or selectable weighting, the weighting of the current segments of the next phase are increased in turn to avoid glitches. In this manner, the handoff from one phase clock to another may be automatic and smooth as the phase delay increases in the received serial clock.

A phase generator circuit or a multiplexer circuit may be used to generate or multiplex which of the clock phases are used to switch on and off the switches 412A-412B. As the switches 412A-412B are transistor switches, the multiplexer may be used to selectively couple the clock phases to the control gates of the transistor switches.

Detailed Phase Interpolator

Components and operation of embodiments of phase interpolators were generally described with reference to FIGS. 4A-4D.

Referring now to FIGS. 5A-5D, detailed schematic diagrams of a phase interpolator (PI) system 500 are shown. The phase interpolator (PI) system 500 may be used as an embodiment of the phase interpolator circuit 202 illustrated in the clock and data recovery circuit loop 200.

To generate a fifty percent duty cycle serial receive clock 501, the PI system 500 includes a phase generator 502, a ramp control signal decoder 504, a first sample clock generator 506A, and second sample clock generator 506B, and a set/reset flip flop 508 coupled together as shown. If a fifty percent duty cycle serial receive clock 501 is unnecessary, the PI system 500 may include a phase generator 502, a ramp control signal decoder 504, and a first sample clock generator 506A without the second sample clock generator 506B and the set/reset flip flop 508.

The phase generator 502 receives a zero degree phase shifted (in-phase) serial receive clock 520 and a ninety degree phase shifted (orthogonal) serial receive clock 529 that is ninety degrees out of phase or orthogonal to the zero degree phase shifted (in-phase) serial receive clock 520. In response to the in-phase serial receive clock 520 and the orthogonal serial receive clock 529, the phase generator 502 generates the phase one clock $\Phi_1$ (PHI 1) 451, the phase two clock $\Phi_2$ (PHI 2) 452, the phase three clock $\Phi_3$ (PHI 1B) 453, and the phase four clock $\Phi_{14}$ (PHI 2B) 454. The phase three clock $\Phi_3$ 453 is an inverted phase one clock $\Phi_1'$ (PHI 1B). The phase four clock $\Phi_4$ 454 is an inverted phase two clock $\Phi_2'$ (PHI 2B).

The ramp control signal decoder 504 includes a digital decoding circuit to convert a desired phase position into control signals to selectively control the circuit and adjust the phase position in the serial receive clock. The ramp control signal decoder 504 may receive a phase advance signal 216A and a phase retard signal 216B as well as the phase one clock $\Phi_1$ (PHI1) 451 and the phase two clock $\Phi_2$ (PHI2) 452 to generate the proper sequence of the segment control signals 551,552 that are coupled into the sample clock generators 506A-506B.

Depending upon what clocks are generated for the phase one clock $\Phi_1$ (PHI1) 451 and the phase two clock $\Phi_2$ (PHI2) 452 by the phase generator circuit 502 in response to the quadrant control signals (e.g., QUAD1, QUAD0), an appropriate sequence of segment control signals 551,552 are generated. For example, with phase one clock $\Phi_1$ (PHI1) 451 leading phase two clock $\Phi_2$ (PHI2) 452, the sequence of the segment control signals Phi1Seq0 to Phi1Seq31 551 select the current sources that are initially coupled to charge the capacitor 402 to set the phase delay and then the sequence of the segment control signals Phi2Seq0 to Phi2Seq31 552 are used to select the current sources that are secondarily coupled to charge the capacitor 402 with a constant slope and trigger the reset or triggering circuit. However, if the phase two clock $\Phi_2$ (PHI2) 452 alternatively leads the phase one clock $\Phi_1$ (PHI1) 451, the sequence of the segment control signals Phi2Seq0 to Phi2Seq31 552 is generated first with the sequence of the segment control signals Phi1Seq0 to Phi1Seq31 551 generated beginning in the next consecutive phase before triggering the reset or triggering circuit.

A binary code input may represent a range of values, such as from 0 to 128, to select the desired phase position in the serial receive clock within a quadrant. In response to which clocks are used to generate the phase one clock $\Phi_1$ (PHI1) 451 and the phase two clock $\Phi_2$ (PHI2) 452, thermometer codes for selecting the N current segments in the first phase and the 32-N current segments in the second phase are decoded to select the desired phase position within the given quadrant. The annotations at the bottom of FIG. 4C show the code values for a given phase position. For example, the code values for phase one P1 are: I phase is 31 to 1, Q phase is 1 to 31, In phase is 0, and Qn phase is 0 as is illustrated in FIG. 4C. The code values may increment or decrement by one count in response to the advance/retard signals to avoid phase steps being taken that may overly shorten the charge cycle of the capacitor so that the self reset has sufficient time to complete.

The ramp control signal decoder 504 may include a zero to 32 bit up/down counter decoder. The phase advance signal 216A and the phase retard signal 216B may cause the 32 bit up/down counter to count up or down by one and alter the sequence of the segment control signals 551,552 in generating the variable slope 463 and the constant slope 467 in the output waveform 450 shown in FIG. 4B for the output signal on the output Vout 450.

The first sample clock generator 506A receives the phase one clock $\Phi_1$ (PHI1) 451 and the phase two clock $\Phi_2$ (PHI2) 452. The second sample clock generator 506B receives the phase three clock $\Phi_3$ (PHI1B) 453 and the phase four clock $\Phi_4$ (PHI 2B) 454. The first sample clock generator 506A generates a serial clock output 550R with a phase shifted rising edge in response to the phase one clock $\Phi_1$ (PHI1) 451 and the phase two clock $\Phi_2$ (PHI2) 452. The second sample clock generator 506B generates a serial clock output 550F with a phase shifted falling edge in response to the phase three clock $\Phi_3$ (PHI1B) 453 and the phase four clock $\Phi_4$ (PHI2B) 454. The serial clock output 550R with the phase shifted rising edge and the serial clock output 550F with the phase shifted falling edge are coupled into the set and reset inputs of the set/reset flip flop 508 to generate the fifty percent duty cycle serial receive clock 501.

The set/reset flip flop 508 generates the fifty percent duty cycle serial receive clock 501 on its Q output in response to the serial clock output 550R and the serial clock output 550F at its set and reset inputs.

Figure 5A:
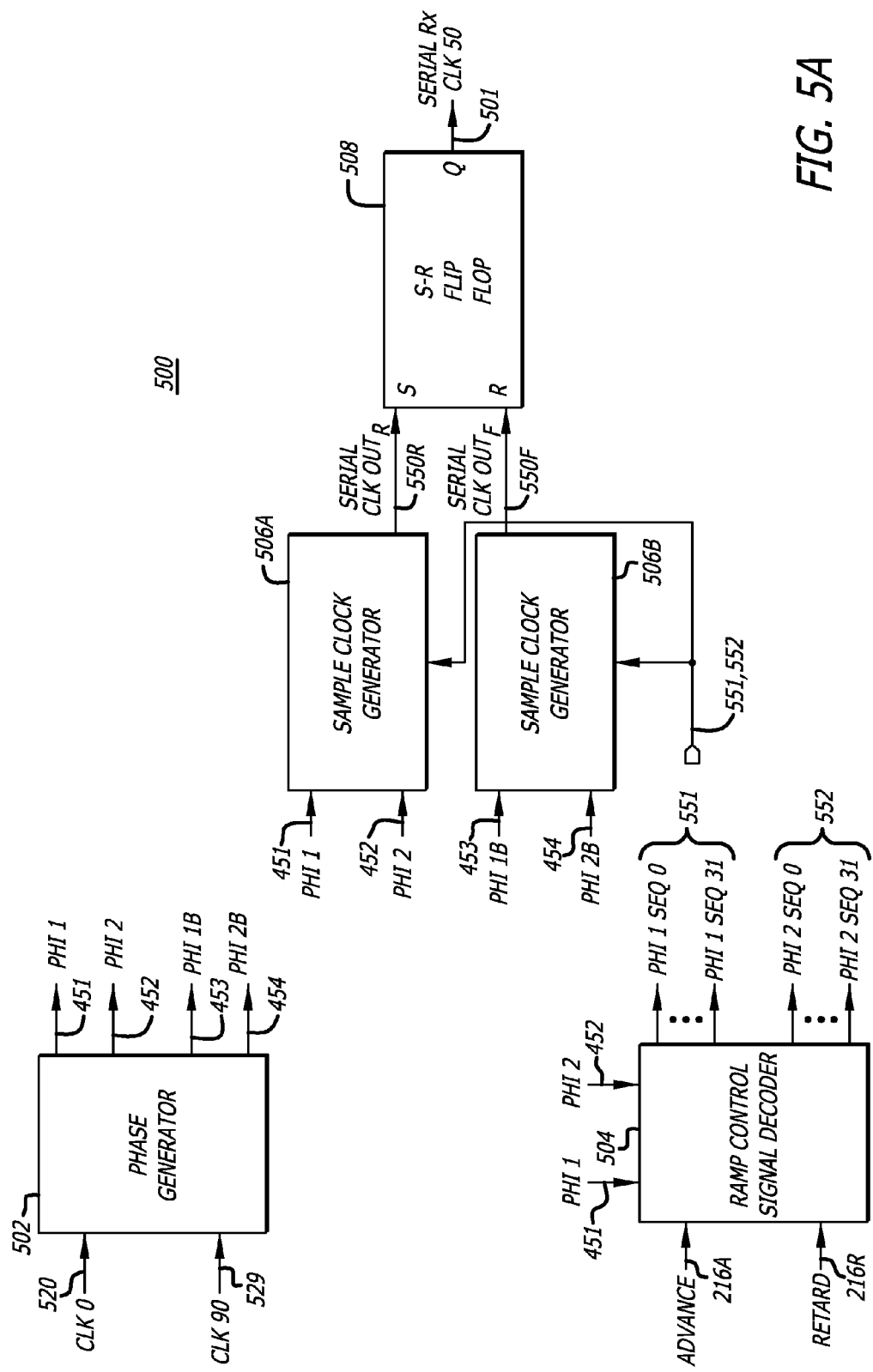
FIG. 5A is a functional block diagram of another embodiment of a phase interpolator.
Figure 5B:
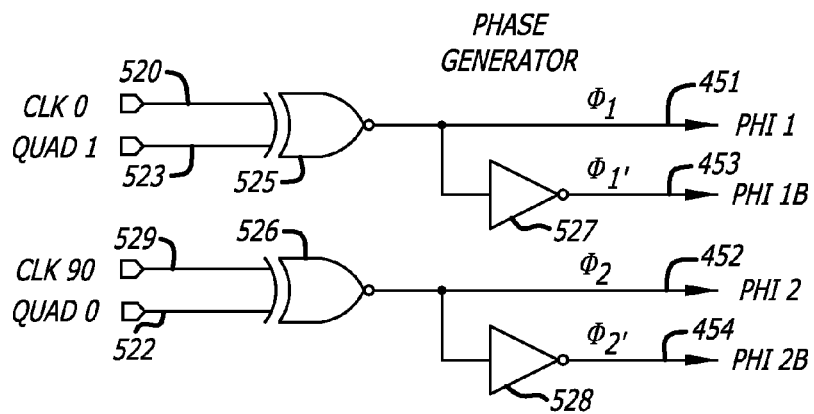
FIG. 5B is a schematic diagram of an exemplary phase generator that may be instantiated into the phase interpolator of FIG. 5A.

Referring now to FIG. 5B, an exemplary phase generator circuit 502 is illustrated. As mentioned previously with reference to FIG. 4C, quadrant and even cycle handoff may occur in the generation of the selectable phase delay range 469. The phase generator circuit 502 is used to generate the clock phases which may selectively be used to turn on and off the inverter 510A in each of the current segments 505A-505M to charge up the capacitor 402 and increase the output voltage of the output signal on the output Vout 450.

The phase generator circuit 502 may include a pair of exclusive-nor logic gates 525-526 and a pair of inverter logic gates 527-528 coupled together as shown. The exclusive-nor gate 525 receives the in-phase reference clock CLK0 520 and a second quadrant control bit QUAD1 523. The exclusive-nor gate 526 receives the orthogonal-phase reference clock CLK90 529 and a first quadrant control bit QUAD0 522.

If both of the second quadrant control bit QUAD1 523 and the first quadrant control bit QUAD0 522 are logically zero, then the phase clock one output phi1 451 and the phase clock two output phi2 452 from the respective exclusive-nor gates 525-526 are respectively zero/ninety degrees phase clocks with the rising edge of phi1 output 451 leading the rising edge of the phi2 output 452. In this case, the inverted phase clock one output phi1B 453 and the inverted phase clock two output phi2B 454 output from the respective inverters 527-528 are also zero/ninety degrees phase clocks with the falling edge of phi1B output 453 leading the falling edge of the phi2B output 454.

If the second quadrant control bit QUAD1 523 is logically zero and the first quadrant control bit QUAD0 522 is logically one, then the phase clock one output phi1 451 and the phase clock two output phi2 452 from the respective exclusive-nor gates 525-526 are respectively ninety/one-hundred-eighty degrees phase clocks with the rising edge of the phi2 output 452 leading the rising edge of phi1 output 451. In this case, the inverted phase clock one output phi1B 453 and the inverted phase clock two output phi2B 454 output from the respective inverters 527-528 are also ninety/one-hundred-eighty degrees phase clocks with the falling edge of the phi2B output 454 leading the falling edge of phi1B output 453.

If both of the second quadrant control bit QUAD1 523 and the first quadrant control bit QUAD0 522 are logically one, then the phase clock one output phi1 451 and the phase clock two output phi2 452 from the respective exclusive-nor gates 525-526 are respectively one-hundred-eighty/two-hundred-seventy degrees phase clocks with the rising edge of phi1 output 451 leading the rising edge of the phi2 output 452. In this case, the inverted phase clock one output phi1B 453 and the inverted phase clock two output phi2B 454 output from the respective inverters 527-528 are also one-hundred-eighty/two-hundred-seventy degrees phase clocks with the falling edge of phi1B output 453 leading the falling edge of the phi2B output 454.

If the second quadrant control bit QUAD1 523 is logically one and the first quadrant control bit QUAD0 522 is logically zero, then the phase clock one output phi1 451 and the phase clock two output phi2 452 from the respective exclusive-nor gates 525-526 are respectively two-hundred-seventy/zero degrees phase clocks with the rising edge of the phi2 output 452 leading the rising edge of phi1 output 451. In this case, the inverted phase clock one output phi1B 453 and the inverted phase clock two output phi2B 454 output from the respective inverters 527-528 are also two-hundred-seventy/zero degrees phase clocks with the falling edge of the phi2B output 454 leading the falling edge of phi1B output 453.

In this manner, selection of the second quadrant control bit QUAD1 523 and the first quadrant control bit QUAD0 522 can control the generation of the phases of the clocks that are provided to the sample clock generators 506A-506B illustrated in FIG. 5A. That is, the quadrature input clocks coupled to the sample clock generators are selected by the exclusive-nor gates 525-526. If more than four input phases are available, the exclusive-nor gates 525-526 may be replaced with multiplexers with the phases being selected by additional control signals.

Figure 5D:
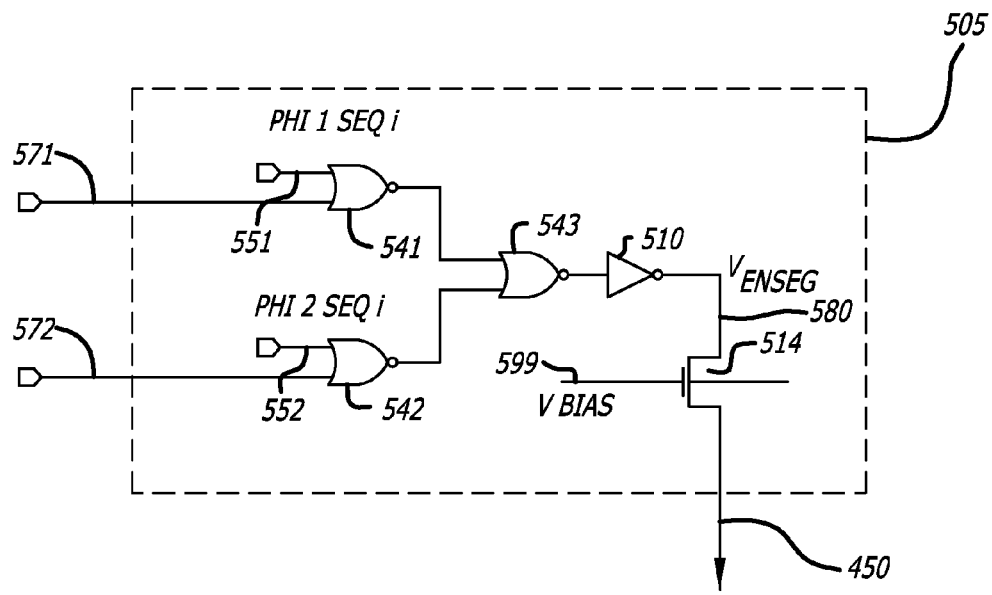
FIG. 5D is a schematic diagram of a current segment instantiated in FIG. 5C.
Figure 5C:
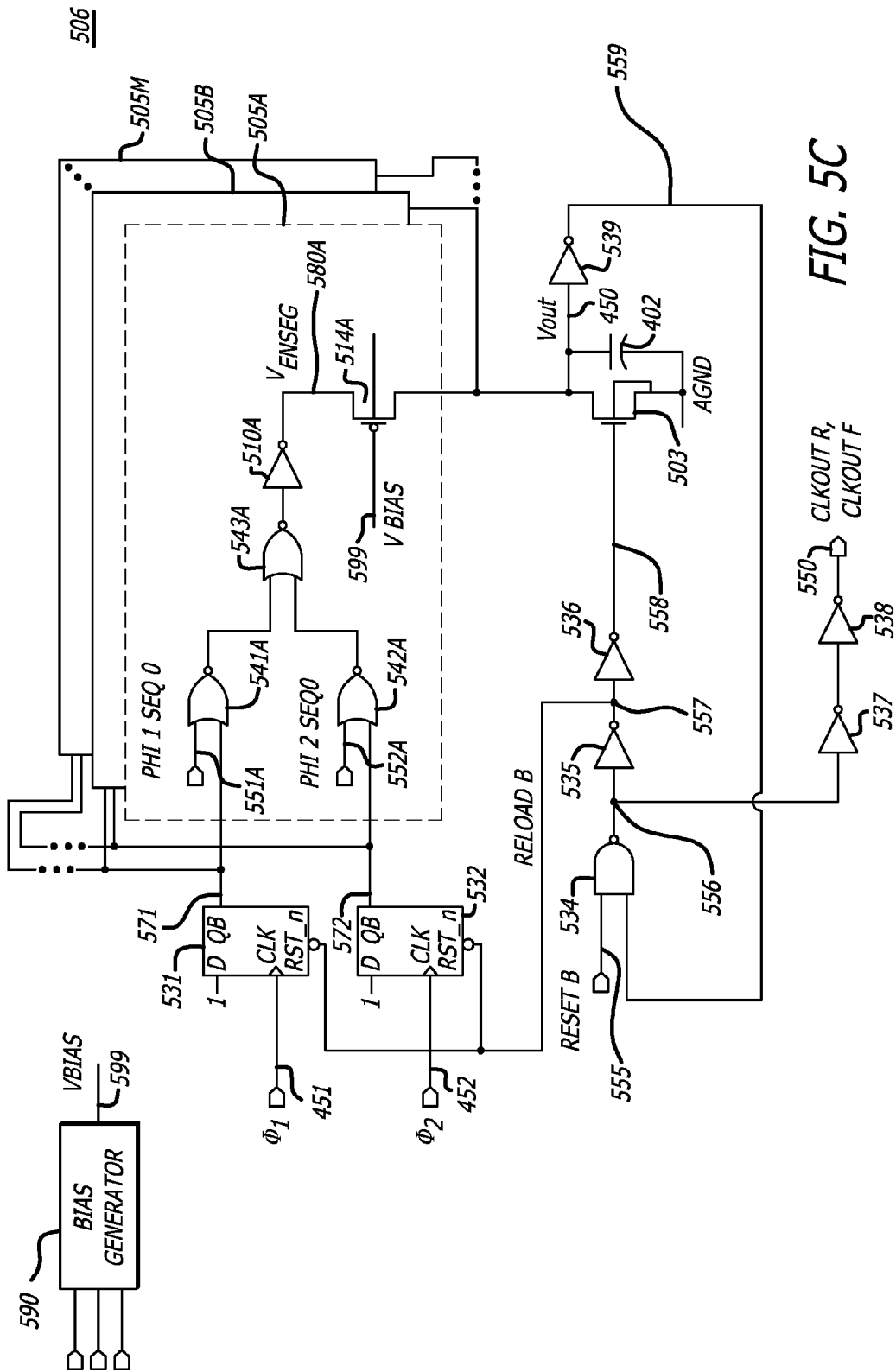
FIG. 5C is a schematic diagram of an exemplary sample clock generator that may be instantiated into the phase interpolator of FIG. 5A.

Referring now to FIG. 5C, an instance of a sample clock generator 506 is shown that is an exemplary embodiment of the first sample clock generator 506A and the second sample clock generator 506B. If the sample clock may have a duty cycle other than fifty percent, a single sample clock generator 506 may be used in the phase interpolator.

The sample clock generator 506 includes N current source segments 505A-505M, a pair of resettable latches or D flip flops 531-532, a reset transistor switch 503, an integrating capacitor 402, a NAND gate 534, inverters 535-539, and a bias generator 590 coupled together as shown.

For the first sample clock generator 506A, clock phase one PHIL Φ1 451 output from the phase generator 502 is coupled into the data D input of the resettable latch/D flip flop 531. Clock phase two PHI2 Φ2 452 output from the phase generator 502 is coupled into the data D input of the resettable latch/D flip flop 532. For the second sample clock generator 506B, inverted clock phase one PHI1B Φ1' 453 output from the phase generator 502 is coupled into the data D input of the resettable latch/D flip flop 531. Inverted clock phase two PHI2B Φ2' 454 output from the phase generator 502 is coupled into the data D input of the resettable latch/D flip flop 532.

The inverter 539 is used to detect when the capacitor 402 has charged to the threshold level Vtrigger 466. The inverter 539 provides a triggering circuit that senses the output voltage of the output signal on the output Vout 450 as the charge from the N current source segments 505A-505M is coupled into the integrating capacitor 402. The switching point of the inverter 539 establishes the level of the triggering threshold voltage Vtrigger 466 illustrated in FIG. 4B.

When triggered, the inverter 539 asynchronously resets the latches/D flip-flops 531-532 by a reloadB signal 557 (generated through NAND gate 534 and inverter 535) and resets the capacitor 402 by a reload signal 558 (generated through NAND gate 534 and inverters 535-536) turning on the reset transistor switch 503. This self triggering circuit is used to make sure the reload/reset moves along as Φ1 and Φ2 are handed quadrant to quadrant.

Additionally, the resetB input signal 555 coupled into the NAND gate 534 resets the circuit into known startup state when it is first initialized. The output of inverter 535 is coupled into the active low reset input of the pair of latches/D flip-flops 531-532 to clear the stored phase input into each. The inverters 537-538 provide an output buffer to the serial received clock output 550 (clkoutr 550R, clkoutf 550F).

The NAND gate 534 and inverters 535-536 provide some delay in respectively generating the active low and active high reload signals 557-558, stretching out the reload pulse such that it is sufficient to effectively reset the latches 531-532 and the reset switch 503. Additionally, the delay allows the edge of the serial received clock output clkout 550 to be generated prior to switching on the reset transistor 503 and grounding out the output Vout 450 and the output signal thereon to analog ground AGND.

The reset transistor switch 503 may be an N-channel field effect transistor (NFET).

Referring now to FIG. 5D, an instance of a current source segment 505 that may be instantiated into the M current source segments 505A-505M is illustrated. Each of the M current source segments 505A-505M includes two input NOR gates 541-543, an inverter 510, and a source switched P-channel field effect transistor (PFET or PMOSFET) 514 coupled together as shown.

For each of the M current source segments 505A-505M, the two input NOR gates 541-543 form a switch controller coupled to the control terminal of a high speed current switch. The high speed current switch is provided by the pull-up transistor (PFET) of the inverter 510 that has its control terminal (gate) coupled to the switch controller. The high speed current switch selectively couples a current source (provided by source switched PFET 514 with its gate biased by the bias voltage VBIAS 599) to the integrating capacitor 402 in response to the phase one selection control signal PHI1SEQi 551i on an edge of the phase one clock PHI1 451 or in response to the phase two selection control signal PHI2SEQi 552i on an edge of the phase two clock PHI2 452.

FIG. 5C illustrates an instantiation of the current source segment 505 as a first current source segment 505A of the M current source segments that receives its respective control signals PHI1SEQ0 551A and PHI2SEQ0 552A generated by the ramp control signal decoder 504.

In FIG. 5D, the NOR gate 541 in each segment has one input coupled to the inverted Q output QB 571 of the latch/D flip-flop 531, a first storage device that captures an edge of the phase one clock PHI1 451. The second input of the NOR gate 541 is coupled to a respective phase one selection control signal PHI1SEQi 551i generated by the ramp control signal decoder 504.

The NOR gate 542 in each segment has one input coupled to the inverted Q output QB 572 of the latch/D flip-flop 532, a second storage device that captures an edge of the phase two clock PHI2 452. The second input of the NOR gate 542 is coupled to a respective phase two selection control signal PHI2SEQi 552i generated by the ramp control signal decoder 504.

The NOR gate 543 in each segment has its two inputs coupled to the outputs of the NOR gates 541-542. The output of NOR gate 543 is coupled into the input of inverter 510. The output Venseg 580 of the inverter 510 is coupled to the source of the PFET 514 to provide a high speed switch.

When the input of the inverter 510 switches from a high logic level to a low logic level, the output Venseg 580 switches from a low logic level to a high logic level to provide a source of voltage and current to the PFET 514 through its own PFET pull-up transistor which is coupled to a positive power supply VDD.

As previously mentioned, the source of the PFET 514 is coupled to the output of the inverter 510. The control gate of the PFET 514 in each current segment 505A-505M has its control gate coupled to a bias voltage Vbias 599 generated by the bias generator 590. The PFET 514 in each current segment 505A-505M may steer a unit of constant current into the capacitor 402 when its source is switched on by the inverter 510.

Initially, each sample clock generator 506A,506B is reset by an active low reset signal (resetb) 555. The active low reset signal 555 is coupled into the NAND logic gate 534. When the active low reset signal 555 is set to a low logic level, the output 556 of the NAND gate 534 is switched to a high logic level. The output 556 of the NAND gate 534 is coupled into the input of inverters 535 and 537.

During reset of the phase interpolator and each sample clock generator, as well as during recycling or reload, the reload signal reloadB 557 coupled into active low reset inputs of the latches/D flip-flops 531-532 is driven to a low logic level. This resets the bits stored in the latches/D flip-flops 531-532 so that the inverted outputs QB 571-572 of each are reset to a high logic level. With the inverted outputs QB 571-572 being a high logic level, the logic of the NOR gates 541-543 and the inverter 510, the output Venseg 580 is reset to a low logic level. If both the phase one selection control signal PHI1SEQi 551i and the phase two selection control signal PHI2SEQi 552i remain high logic levels, then the logic provided by the NOR gates 541-543 and inverter 510 assures that the output Venseg 580 remains at a low logic level.

The array of NOR gates 541A-541M (NOR gate 541 representing one) in the respective current segments 505A-505M respectively select how many current segments (N) are turned on coincident with the rising clock edge of phi1 (Φ1) clock 451 to initially begin charging up the capacitor 402. When a rising clock edge of the phi1 (Φ1) clock 451 is coupled into the clock input of the latch/D-flip flop 531, the logic one coupled into its D input is latched therein causing the inverted output QB 571 to be driven to a logic low level. The logic low level from the inverted output QB 571 is coupled into an input of each of the NOR gates 541A-541M. If a respective phase one selection control signal PHI1SEQi 551i (PHI1SEQ0 551A-PHI1SEQm 551M) is also driven to a low logic level, the output of the respective NOR gate 541 (NOR gates 541A-541M) is a high logic level that drives the respective voltage enable node Venseg 580 (580A-580M) towards a high logic level and switch on the respective transistor 514 (514A-514M) to allow a current to flow and charge the capacitor 402.

The array of NOR gates 542A-542M (NOR gate 542 representing one) in the respective current segments 505A-505M respectively select how many of the remaining current segments (M−N) are turned on coincident with the rising clock edge of phi2 (Φ2) clock 452 to assist in charging up the capacitor 402 with the N current segments over a constant slope. When a rising clock edge of the phi2 (Φ2) clock 452 is coupled into the clock input of the latch/D-flip flop 532, the logic one coupled into its D input is latched therein causing the inverted output QB 572 to be driven to a logic low level. The logic low level from the inverted output QB 572 is coupled into an input of each of the NOR gates 542A-542M. If a respective phase two selection control signal PHI2SEQi 552i (PHI2SEQ0 552A-PHI2SEQm 552M) is also driven to a low logic level, the output of the respective NOR gate 542 (NOR gates 542A-542M) is a high logic level that drives the respective voltage enable node Venseg 580 (580A-580M) towards a high logic level and switch on the respective transistor 514 (514A-514M) to allow a current to flow and additionally charge the capacitor 402.

In the first charging phase of the capacitor 402, N of the segments 505A-505M have their sources switched on by the respective inverters 510 in response to the control signals 551. In the second charging phase of the capacitor 402, M−N of the segments 505A-505M then have their sources switched on by the inverters 510 in response to the control signals 552 so that all M the units of constant current sources are used to charge the capacitor 402 with a constant slope 467. In one embodiment of the invention, the value of M is 32.

Note that the phase interpolator circuit 500 has no cycle to cycle memory. Thus, the phase position can be updated as often as every cycle provided that the decoder 504 can decode the thermometer code sufficiently quick (e.g., within a cycle time) to generate the segment control signals 551,552 that are coupled into the sample clock generators 506A-506B. This allows the phase interpolator circuit 500 to generate high offset frequencies.

The phase interpolator circuit 500 may be relatively compact with low power consumption as it may be implemented using a few standard logic cells and simple current sources. Moreover, the analog functionality of current sources charging the integrating capacitor in the phase interpolator circuit 500 are basic analog functions that may be readily replicated in different semiconductor manufacturing processes.

CONCLUSION

The embodiments of the phase interpolator can provide phase interpolation through the use of a two phased weighted charging of a capacitor. The embodiments of the phase interpolator further can provide a constant threshold voltage detection for uniformity in the step size of the phase delay, regardless of capacitance linearity of the capacitor with respect to voltage. The embodiments of the phase interpolator further can provide a continuous handoff of input phases to provide a substantial range of phase delay. The embodiments of the phase interpolator further provide a self resetting charge circuit to substantially charge the integrating capacitor and perform a reset cycle within a single clock cycle.

The embodiments of the invention are thus described. While certain exemplary embodiments have been described and shown in the accompanying drawings, it is to be understood that such embodiments are merely illustrative of and not restrictive on the broad invention, and that the embodiments of the invention not be limited to the specific constructions and arrangements shown and described, since various other modifications may occur to those ordinarily skilled in the art. For example, a quadrature phase clock input need not be used as the input clock. Any number of clock phases greater than two may be used to clock the phase interpolator such as in a ring oscillator circuit that may operation with 3, 5, or 11 clock phases. Moreover, the phase generator function of input phase selection may be reduced or eliminated if a latch for each input phase and additional current sources are used in each leg of the phase interpolator. Additionally, multiple phase interpolators may be used in parallel to create multiple output phases, such as when a quadrature input is provided and a quadrature output is desired. Instead, the embodiments of the invention should be construed according to the claims that follow below.

What is claimed is:

1. A method comprising:
discharging a capacitor to reduce the voltage across the capacitor to zero;
selecting a phase delay for a clock output signal;
charging the capacitor with a first weighted current during a first phase input clock, the first weighted current weighted N out of M to charge the capacitor with a predetermined rate of change in voltage in response to the selected phase delay;
charging the capacitor with a second weighted current during a portion of a second phase input clock differing from the first phase input clock, the second weighted current weighted M out of M to charge the capacitor with a constant rate of change;
determining if a voltage across the capacitor is greater than or equal to a threshold voltage to generate a first edge of the clock output signal with the selected phase delay; and
a predetermined period of time after the generation of the first edge in the clock output the method further includes generating a second edge of the clock output signal; and
discharging the capacitor to reduce the voltage across the capacitor to zero to reset it for the next charging cycle and the next generation of the first edge in the clock output signal.

2. The method of claim 1, wherein
the second phase input clock is orthogonal to the first phase input clock.

3. A method comprising:
discharging a capacitor to reduce the voltage across the capacitor to zero,
selecting a phase delay for a clock output
charging the capacitor with a first weighted current during a first phase input clock, the first weighted current weighted N out of M to charge the capacitor with a predetermined rate of change in voltage in response to the selected phase delay;
charging the capacitor with a second weighted current during a portion of a second phase input clock differing from the first phase input clock, the second weighted current weighted M out of M to charge the capacitor with a constant rate of change;
determining if a voltage across the capacitor is greater than or equal to a threshold voltage to generate a first edge of the clock output signal with the selected phase delay; and
selecting a pair of consecutive quadrature clocks as the first phase input clock and the second phase input clock.

4. The method of claim 3, further comprising:
handing off from one quadrature clock to another quadrature clock to select the pair of consecutive quadrature clocks as the first phase input clock and the second phase input clock.

5. The method of claim 1, further comprising:
sampling a serial data stream with the first edge of the clock output signal to determine data bits of the serial data stream.

6. A method comprising:
selecting a phase delay for a clock output signal;
charging a capacitor with a first weighted current during a first phase input clock, the first weighted current weighted N out of M to charge the capacitor with a predetermined rate of change in voltage in response to the selected phase delay;
charging the capacitor with a second weighted current during a portion of a second phase input clock, the second weighted current weighted M out of M to charge the capacitor with a constant rate of change;
determining if a voltage across the capacitor is greater than or equal to a threshold voltage to generate a first edge of the clock output signal with the selected phase delay;
sampling a serial data stream with the first edge of the clock output signal to determine data bits of the serial data stream, wherein a clock signal is embedded in the serial data stream;
generating a second edge of the clock output signal a predetermined period of time after the generation of the first edge in the clock output signal; and
sampling the serial data stream with the second edge of the clock output signal to determine the selected phase delay.

7. The method of claim 3, wherein
the second phase input clock is orthogonal to the first phase input clock.

8. The method of claim 3, further comprising:
a predetermined period of time after the generation of the first edge in the clock output signal,
generating a second edge of the clock output signal; and
discharging the capacitor to reduce the voltage across the capacitor to zero to reset it for the next charging cycle and the next generation of the first edge in the clock output signal.

9. The method of claim 3, further comprising:
sampling a serial data stream with the first edge of the clock output signal to determine data bits of the serial data stream.

10. The method of claim 6, wherein
the second phase input clock is orthogonal to the first phase input clock.

11. The method of claim 6, further comprising:
discharging the capacitor to reduce the voltage across the capacitor to zero to reset it for the next charging cycle and the next generation of the first edge in the clock output signal.

12. The method of claim 6, further comprising:
selecting a pair of consecutive quadrature clocks as the first phase input clock and the second phase input clock; and
handing off from one quadrature clock to another quadrature clock to select the pair of consecutive quadrature clocks as the first phase input clock and the second phase input clock.

* * * * *